United States Patent
Yogev

[11] Patent Number: 6,020,553
[45] Date of Patent: Feb. 1, 2000

[54] PHOTOVOLTAIC CELL SYSTEM AND AN OPTICAL STRUCTURE THEREFOR

[75] Inventor: Amnon Yogev, Rahovot, Israel

[73] Assignee: Yeda Research and Development Co., Ltd., Rehovot, Israel

[21] Appl. No.: 08/809,712

[22] PCT Filed: Oct. 10, 1995

[86] PCT No.: PCT/US95/12368

§ 371 Date: Apr. 4, 1997

§ 102(e) Date: Apr. 4, 1997

[87] PCT Pub. No.: WO96/11501

PCT Pub. Date: Apr. 18, 1996

[30] Foreign Application Priority Data

Oct. 9, 1994 [IL] Israel ........................................ 111207

[51] Int. Cl.[7] ................................................. H01L 31/052
[52] U.S. Cl. .......................... 136/246; 136/259; 126/573; 126/600; 126/683; 126/684; 126/685; 126/698; 250/200; 250/203.4; 359/831; 359/837
[58] Field of Search ..................................... 136/246, 259; 126/573, 600, 683, 684, 685, 698; 250/200, 203.4; 359/831, 837

[56] References Cited

U.S. PATENT DOCUMENTS

| | | | |
|---|---|---|---|
| 4,029,519 | 6/1977 | Schertz et al. | 136/246 |
| 4,118,249 | 10/1978 | Graven et al. | 136/246 |
| 4,143,234 | 3/1979 | Johnson et al. | |
| 4,419,533 | 12/1983 | Czubatyj et al. | 136/259 |
| 4,500,167 | 2/1985 | Mori. | |
| 4,687,880 | 8/1987 | Morris. | |
| 4,783,373 | 11/1988 | Baumeister et al. | |
| 4,784,700 | 11/1988 | Stern et al. | 138/248 |
| 4,832,002 | 5/1989 | Medina. | |
| 4,964,713 | 10/1990 | Goetzberger | 136/246 |
| 5,022,929 | 6/1991 | Gallois-Montbrun | 136/246 |
| 5,089,055 | 2/1992 | Nakamura | 136/248 |
| 5,261,970 | 11/1993 | Landis et al. | 136/259 |
| 5,272,356 | 12/1993 | Wen et al. | 257/21 |
| 5,344,497 | 9/1994 | Fraas et al. | 136/246 |
| 5,374,317 | 12/1994 | Lamb et al. | |

OTHER PUBLICATIONS

Yehezkel, "Losses in a Three–Dimensional Computer Parabolic Concentrator as a Second Stage of a Solar Concentrator", Solar Energy, vol. 54, No. 1, Jul. 1, 1993, pp. 45–51, XP000378246.

Arvizu, "Photovoltaic Concentrator Research Progress", Photovoltaic Specialists Conference Las Vegas, Oct. 21–25, 1985, Institute of Electronics Engineers, pp. 1529–1536, XP000132141.

*Primary Examiner*—Alan Diamond
*Attorney, Agent, or Firm*—Greenblum & Bernstein, P.L.C.

[57] ABSTRACT

High radiation concentration photovoltaic cell system including at least one optical structure in the form of a three-dimensional body having a first surface adapted to receive thereon photovoltaic cells and a second surface to be, at least indirectly, exposed to light radiation. The body of the optical structure has formed between its first and second surfaces a two-dimensional array of contiguous light radiation concentrators each in the form of an individual prismatic body portion. Each prismatic body portion tapers in two dimensions toward said first surface along the entire length of the concentrator. Each concentrator defines on the first surface a photovoltaic cell-attaching area to be aligned with an active portion of a single photovoltaic cell to be attached thereto. The system may further include at least one separate distantly located solar radiation collecting and/or reflecting sun-tracking device arranged to direct solar radiation to be impinged in two dimensions on the second surface of the entire array of the radiation concentrators.

38 Claims, 7 Drawing Sheets

PHOTOVOLTAIC CELL SYSTEM AND AN OPTICAL STRUCTURE THEREFOR

BACKGROUND OF THE INVENTION

1. Field of the Invention

The present invention relates to a high radiation concentration photovoltaic cell system, and more particularly to an optical structure, constituting light radiation concentrators for photovoltaic cells in combination with a solar radiation collecting and/or reflecting device, forming a photovoltaic cell system.

2. Discussion of Background

Solar photovoltaic cells are usually produced as small units, each capable of producing limited electric power in the range of a few watts. For large scale applications, it is necessary to integrate many cells to form a module that can produce higher electric power. Due to mechanical limitations, very close packing of cells is very difficult and in many cases, each cell has a small area with inactive material. When such a module is formed, a portion of the area of the module is inactive and when oriented towards the sun, a fraction of the light that is incident on this area is not utilized. Moreover, when the module is used for converting concentrated solar radiation to electricity, this fraction of concentrated radiation can damage the module.

In cases where a powerful solar radiation source is used, a multitude of solar cells are necessary for the conversion of all available solar radiation light to electric power. A homogenous or stable distribution of light is important for designing parallelly or serially connected cells, since the output of single module does not provide sufficient current or voltage large scale systems.

Using non-ideal radiation collecting systems, however, the concentrated solar light at the focal point is not homogeneous and usually it is more concentrated at the center of the radiated beam. The distribution of light within the beam varies with time due to astigmatism and other aberrations of the concentrating devices. Moreover, when selective spectrum illumination is used to excite the cells, very high initial concentration is required. As an example, it can be shown that commercial cells are available that operate efficiently at solar concentrations of 500 suns with efficiency more than 20%. Experiments carried out demonstrated that if only the spectral band between 0.7 and 0.9 micron is used, the efficiency increases to 43%. This spectral band contains only 20% of the incident solar radiation and hence, in order to achieve the same concentration, a concentration factor of 2500 is needed. In order to achieve this concentration, solar radiation tracking systems are necessary when utilizing a dish-like system, a concentration factor of 10000 can be achieved, but in central receiver systems a non-imaging concentrator is needed.

SUMMARY OF THE INVENTION

It is therefore first a broad object of the present invention to ameliorate the disadvantages of the prior art photovoltaic cell modules and to provide an optical structure for mounting a plurality of photovoltaic cells producing substantially total internal reflections.

It is a further broad object of the present invention to provide a photovoltaic cell system combining the optical structure of the present invention with a solar radiation collecting and/or reflecting arrangement.

It is still a further object of the present invention to provide a high radiation concentration, photovoltaic cell system utilizing homogenous collected solar radiation.

In accordance with the present invention, there is therefore provided a high radiation concentration, photovoltaic cell system, comprising at least one optical structure in the form of a three-dimensional body having a first surface and a second surface, said body being made of a material at least partly transparent to light and having formed between said surfaces an array of contiguous light radiation concentrators, wherein said concentrators defining on said first surface photovoltaic cell-attaching areas while said second surface is, at least indirectly, exposed to light radiation, and at least one solar radiation collecting and/or reflecting device arranged to direct solar radiation to be impinged on said second surface of said optical structure.

The invention further provides an optical structure for forming a photovoltaic cell system, comprising at least one optical structure in the form of a three-dimensional body having a first surface and a second surface, said body being made of a material at least partly transparent to light and having formed between said surfaces an array of contiguous light radiation concentrators, wherein said concentrators defining on said first surface photovoltaic cell-attaching areas while said second surface is, at least indirectly, exposed to light radiation.

The invention will now be described in connection with certain preferred embodiments with reference to the following illustrative figures so that it may be more fully understood.

With specific reference now to the figures in detail, it is stressed that the particulars shown are by way of example and for purposes of illustrative discussion of the preferred embodiments of the present invention only and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

DETAILED DESCRIPTION

Figure 1:
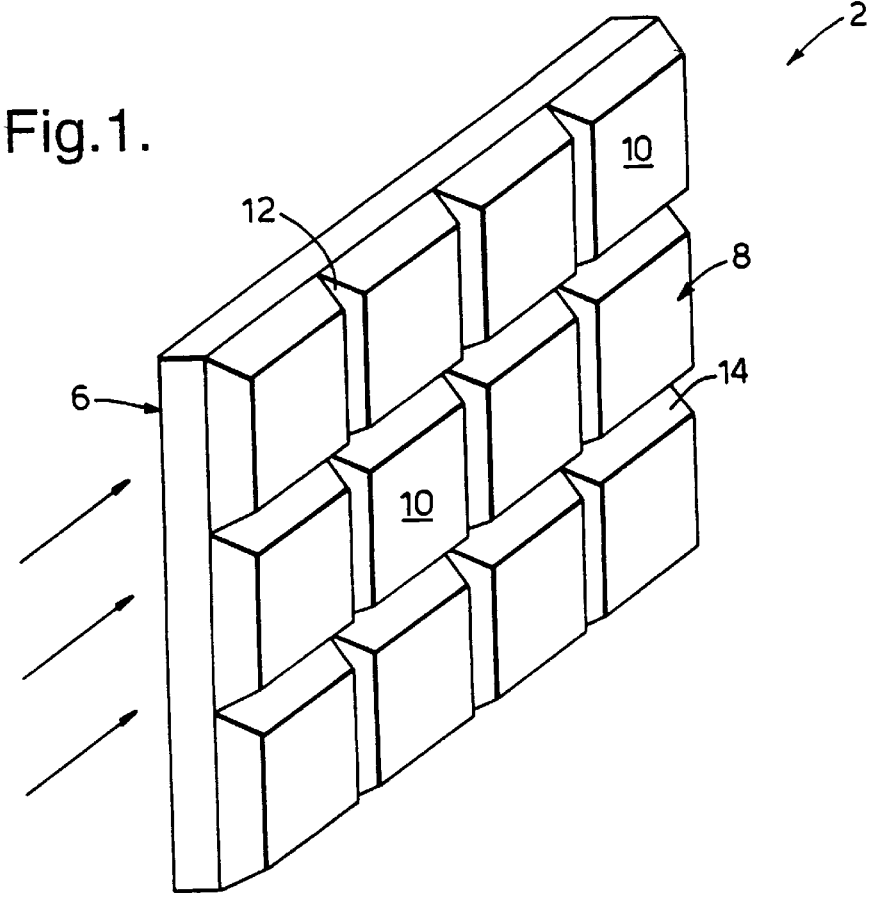
FIG. 1 is an isometric view of an embodiment of an optical structure according to the present invention.
Figure 2:
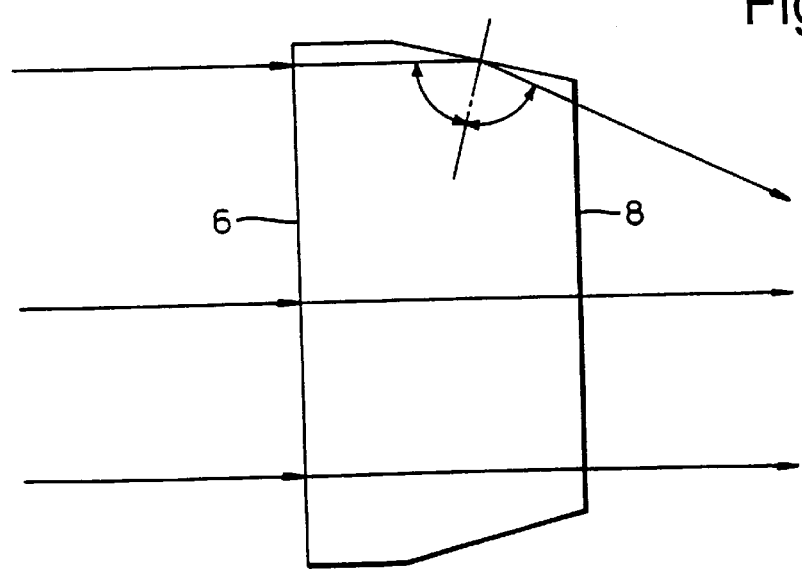
FIG. 2 is a schmatic representation of light rays passing through a single concentrator of the optical structure of FIG. 1.

As illustrated in FIGS. 1 and 2, the optical structure according to the present invention for mounting a plurality of photovoltaic cells (not shown) is a three-dimensional body 2 made of a material at least partly transparent to light. Such material may be glass, glass ceramic, quartz fused silica, sapphire or the like. The body 2 may be configured in any practical shape e.g., prismatic, so as to facilitate eventual juxtapositioning and/or connection to other such bodies. The body 2 has a bottom surface 6 upon which light radiation represented by arrows impinges and an opposite top surface 8 from which the light radiation emerges. On the top surface there is formed an array of cell-attaching active areas 10, constituting non-imaging light radiation concentrators. Each individual cell is placed on the area portion of the concentrators in a way that the light projected onto the surface 6 is due to the geometry of the concentrators, substantially directly propagated and/or totally internally reflected (see FIG. 2) and emerges from the concentrator's surface 8 substantially aligned with the active portion of the photovoltaic cells attached thereto.

One practical manner of achieving such an array of concentrators is to form traversing V-shaped grooves 12,14 defining thereinbetween the areas 10. Naturally, such grooves can be made to follow curved paths or could be circular, so as to define round areas 10, resulting in truncated cones, instead of truncated pyramids shown in FIG. 1. Inversely, the body 2 can be made in such a way as to form trough or dish-shaped concentrators.

The distance between adjacent grooves 12 or 14 and their angular span and thickness should fulfill the following requirements:

a) The narrow part of each individual template of a photovoltaic cell should match the size of the active part of each of the concentrators or solar cells.
b) Most of the light which is incident on the surface 6 of the body 2 will be totally transmitted to the cell by direct propagation or total internal reflection.

At least parts of the body 2 can be coated by selective coatings to enhance transmission or for selective transmission/reflection of different parts of the solar spectrum, to enable selection of the most effective parts of the spectrum for activating the solar cells.

The optical structure hereinbefore described can be incorporated, or be part of, a concentrating system either imaging or non-imaging or part of a complex concentrator made of an assembly of imaging and non-imaging components.

In order to enhance the effectiveness of such photovoltaic optical cell structure, it is proposed to utilize it with a solar radiation collecting and/or reflecting arrangement for directing concentrated solar radiation to be impinged on the optical structure.

Figure 3:
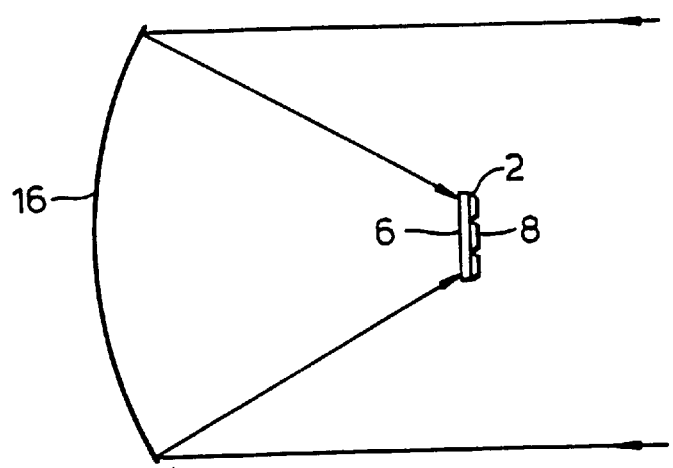
FIGS. 3 to 5 are schematic representations of several embodiments of the system according to the present invention, utilizing one or more dish-type solar radiation collecting devices with one or more optical structures.
Figure 4:
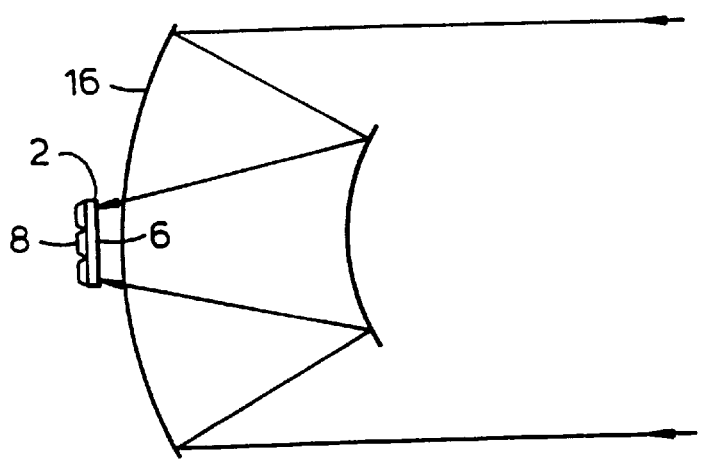
Figure 5:
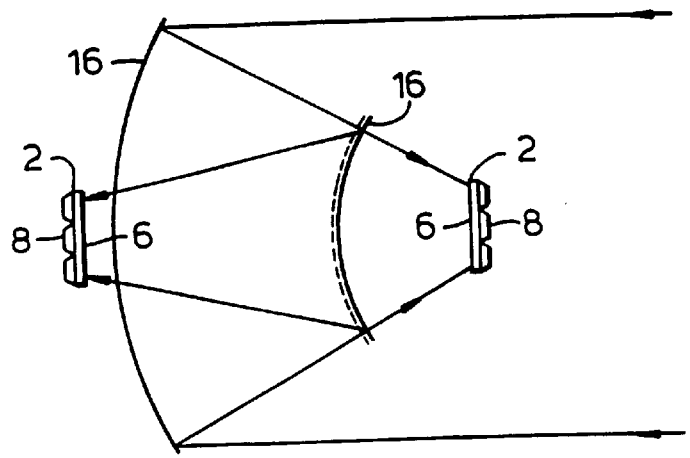

In FIGS. 3 to 5 there are illustrated several possible such arrangements utilizing one or more dish-type or parabolic solar radiation collecting or concentrating devices 16. As seen in these figures, the optical body 2 is located on the concave or convexed side of the dish-shaped device 16 with the surface 6 facing the light radiation as directed by the device 16 to be impinged thereon. In FIG. 5, there are shown two bodies 2 arranged to receive solar radiation from two dish-type devices 16.

Figure 6:
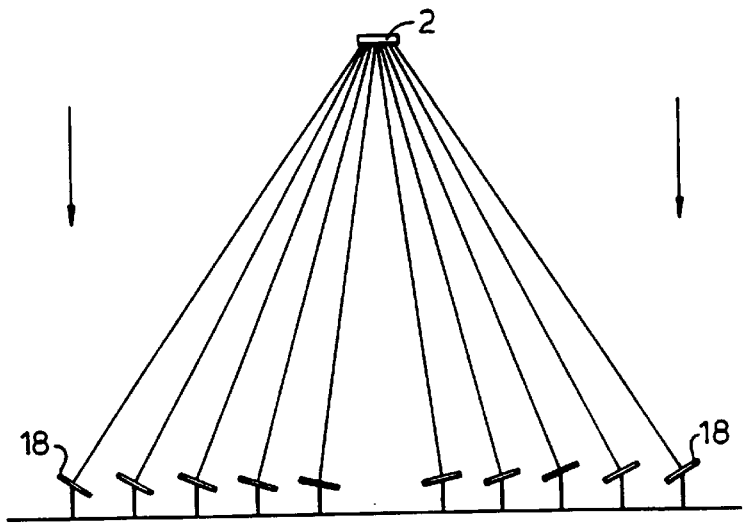
FIGS. 6 to 8 are schematic representations of several other possible embodiments of the present invention, utilizing a plurality of solar radiation reflectors with the combination of the embodiments shown in FIGS. 3 to 5.
Figure 7:
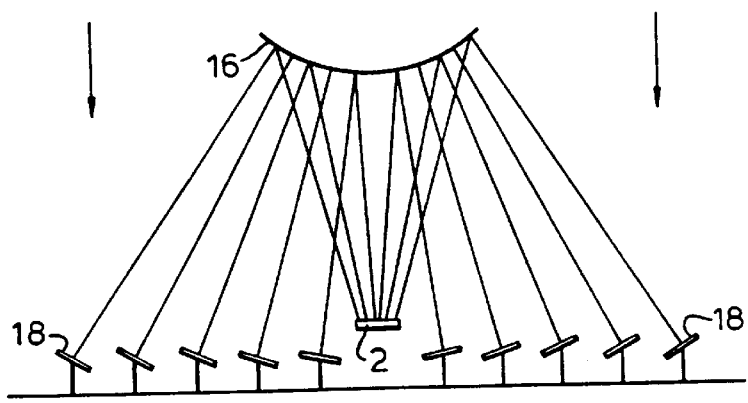
Figure 8:
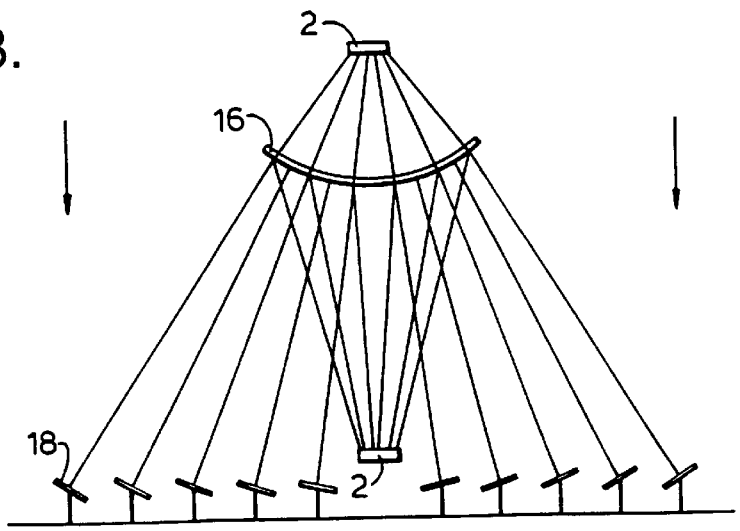

Referring to FIG. 6 there is illustrated a body 2 arranged to receive solar radiation reflected from a multiplicity of devices 18, such as mirrors or other reflecting surfaces. The arrangements shown in FIGS. 7 and 8 are similar to those depicted in FIGS. 4 and 5, except for the reflecting devices 18 initially collecting the solar radiation and directing same onto the dish-type devices 16.

Figure 9:
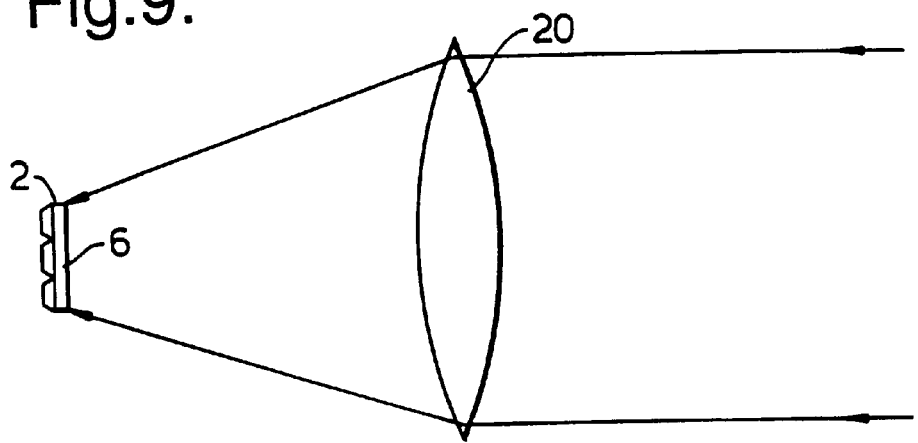
FIGS. 9 to 10 are schematic representations of two further embodiments of the present invention, utilizing one or more lens-type solar radiation devices with one or more optical structures.
Figure 10:
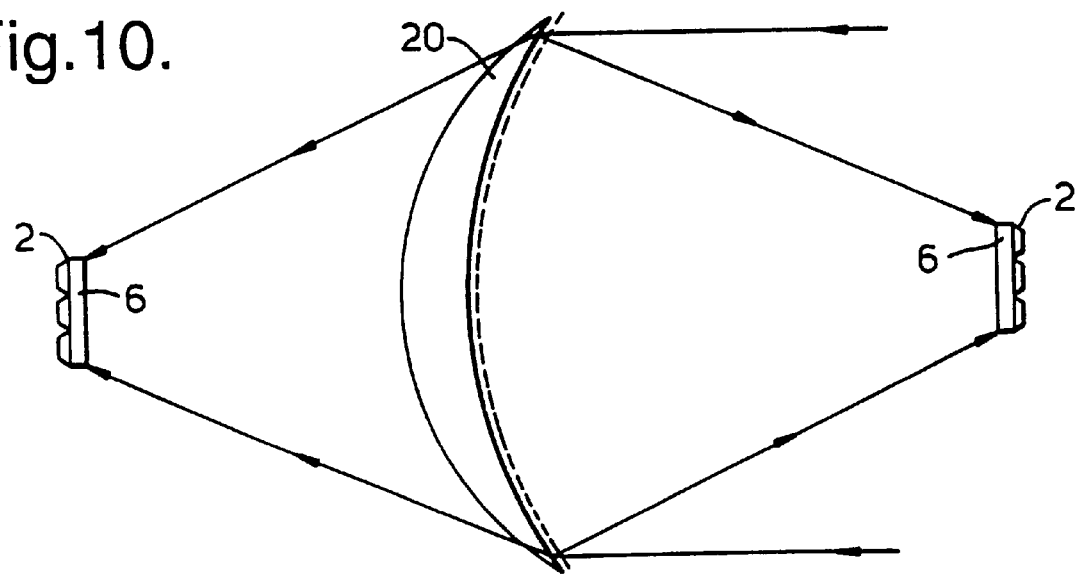

Instead of using dish-type solar concentrating devices 16, lens-type solar concentrating devices 20 having two convex surfaces or one concave and one convexed surface respectively shown in FIGS. 9 and 10, can just as well be used.

Figure 11:
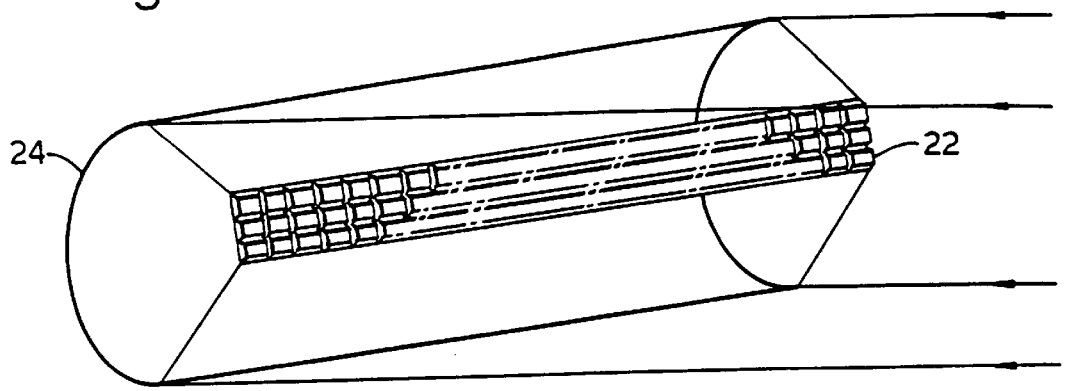
FIGS. 11 to 13 are schematic representations respectively corresponding to FIGS. 3 to 5, however, with trough-like solar radiation collecting devices.
Figure 12:
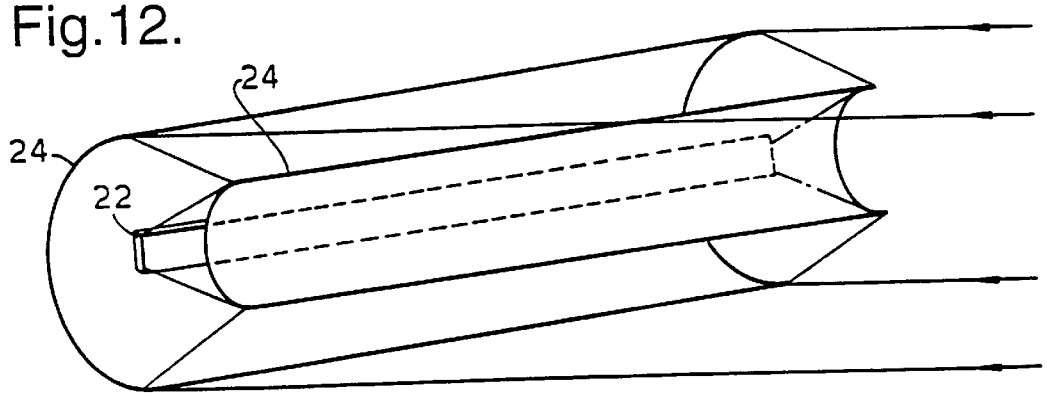
Figure 13:
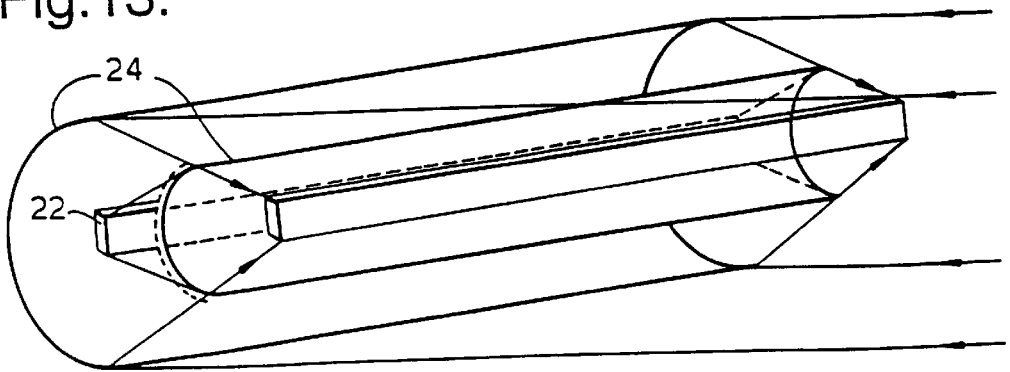

Different configurations of the optical body structure 2 and solar radiation concentrating devices arrangement, is shown in FIGS. 11 to 13. Accordingly, the structure of the optical body 22 is in the form of an elongated bar composed of a bank of interconnected smaller bodies 2, arranged to be impinged on one of its surfaces, by solar radiation collected by elongated trough-shaped devices 24.

Figure 14:
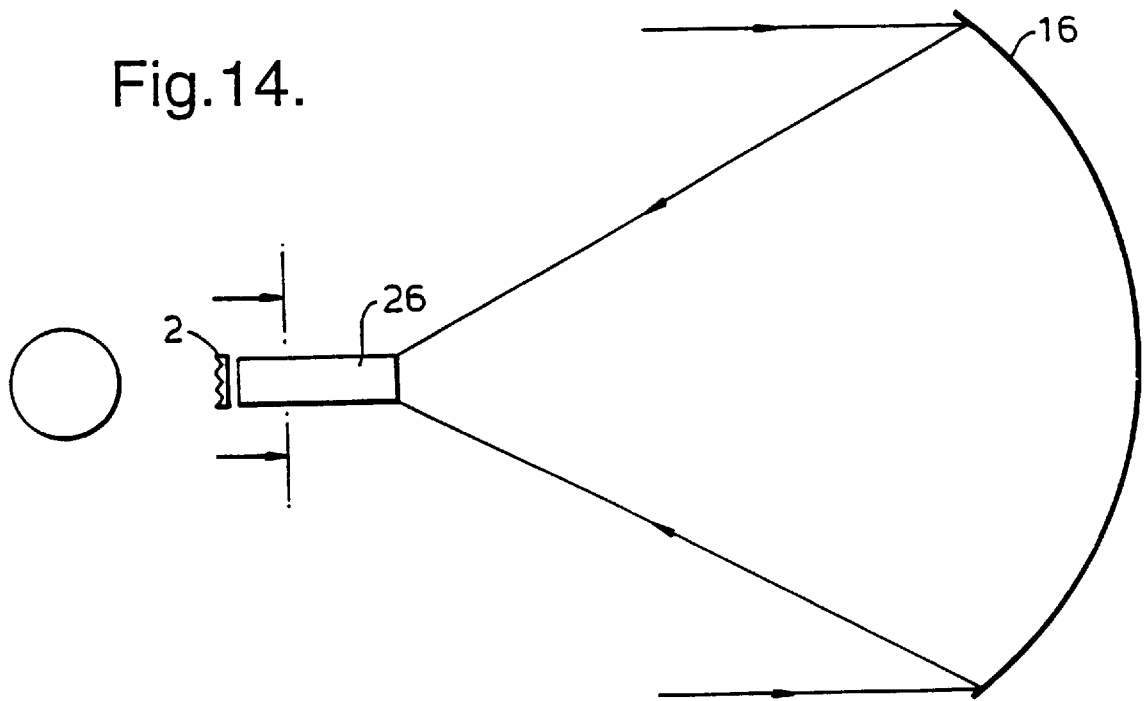
FIGS. 14 to 17 are schematic representations of still further possible embodiments of the present invention employing light guides.
Figure 15:
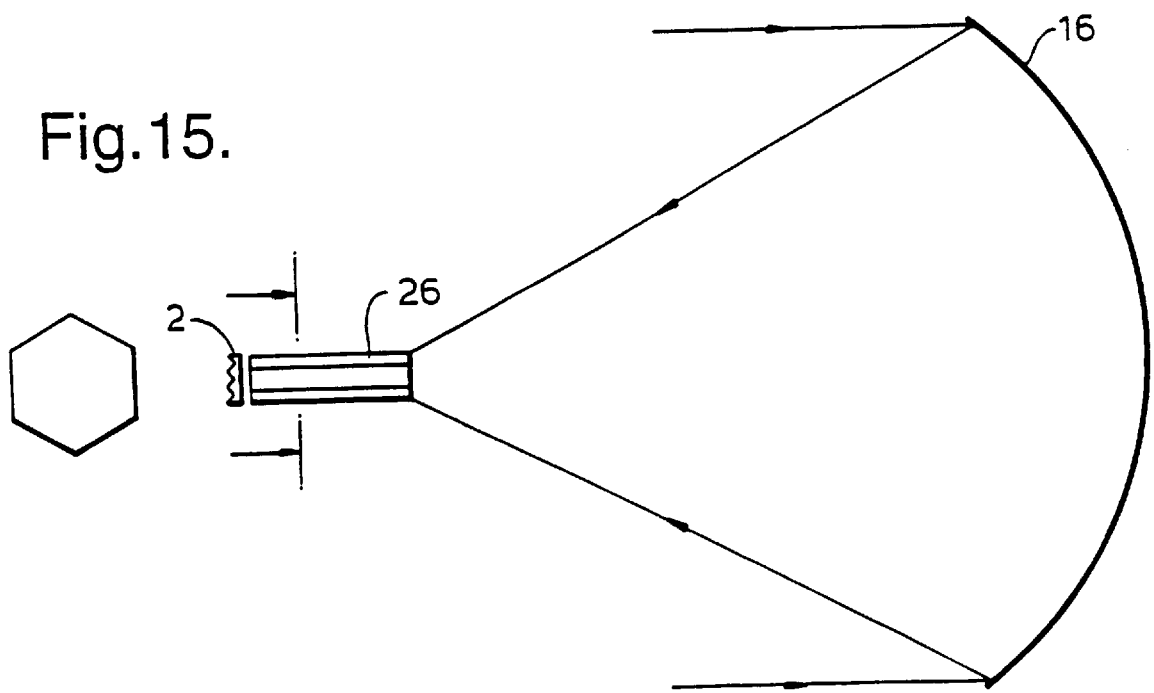

In order to enhance the homogenity of the solar radiation made to impinge on the optical body according to the present invention, a light guide can be coupled to the optical body so that the collected and concentrated light radiation be first passed therethrough to be internally reflected therein prior to impinging on the body, thereby rendering it more homogeneous. Such a light guide 26 can be made of a transparent material and have a circular cross-section as shown in FIG. 14 or a polygonal cross-section, as depicted in FIG. 15.

Figure 16:
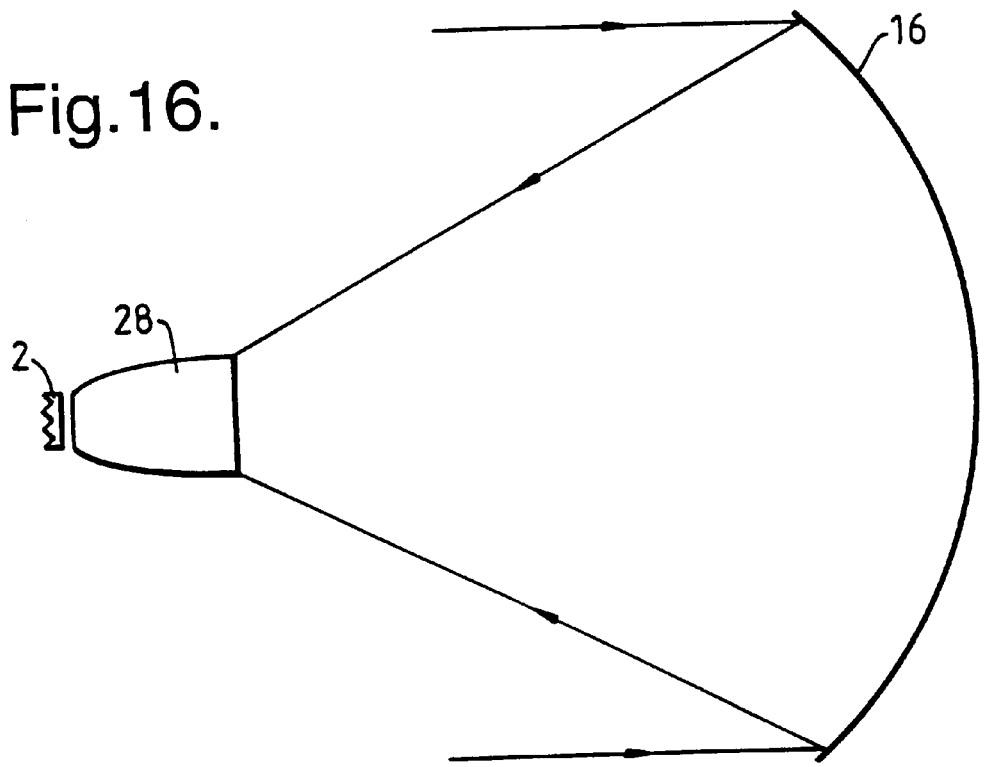
Figure 17:
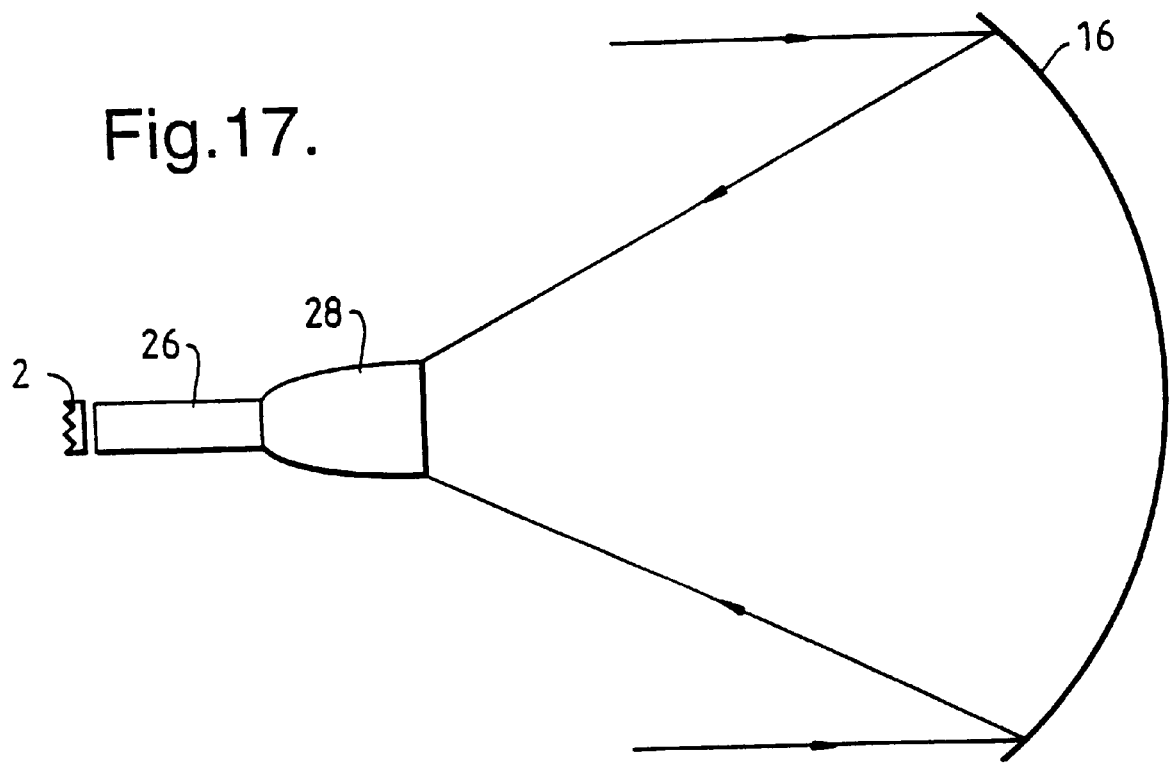

At the entrance of the light guide 26, the light radiation at different locations has different intensities and different directions of propagation. As the light propagates while being reflected internally, the different rays mix and eventually a homogeneous radiation cross section is achieved. The light guide used need not necessarily have a uniform internal cross-section, but could instead be a light converging guide 28, e.g, having conical, internal cross-sections, as shown in FIG. 16. This guide 28 could also be used in combination with a light guide 26 of a uniform internal cross-section, as seen in FIG. 17. When a converging light guide is used, the light is concentrated over a shorter pathway and the homogeneous state will be reached sooner. It should be noted that the concentration power of a conical concentrator is limited and since at each reflection the light is deflected from its original direction, part of the light can be reflected backwards if the concentrator is too long. The conical concentrator can be replaced by another, non-imaging device such as a CPC or CEC. In a central receiver system, the desired concentration cannot be achieved-without an intermediate non-imaging device that acts also as a homogenizer.

Finally, as per-se known, further enhancement of the system can be achieved with sun-tracking apparatus controlling the movement of the solar radiation collectors, concentrators or reflectors.

It will be evident to those skilled in the art that the invention is not limited to the details of the foregoing illustrated embodiments and that the present invention may be embodied in other specific forms without departing from the spirit or essential attributes thereof. The present embodiments are therefore to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A high radiation concentration photovoltaic cell system, comprising:

at least one optical structure comprising a three-dimensional body having a first surface capable of receiving thereon photovoltaic cells and a second surface to be at least indirectly exposed to light radiation, said body being made of a material at least partially transparent to light and having formed between said surfaces a two-dimensional array of contiguous light radiation concentrators each comprising an individual prismatic body portion tapering toward said first surface in two dimensions along the entire length thereof, each concentrator defining on said first surface a photovoltaic cell-attaching area to be aligned with an active portion of a single photovoltaic cell to be attached thereto, and at least one separate distantly located sun-tracking device capable of at least one of reflecting and collecting solar radiation, the sun-tracking device being structured to concentrate solar radiation in two dimensions to be impinged on said second surface of the entire array of said optical structure.

2. The system as claimed in claim 1, wherein said material is one of glass, glass ceramic, quartz fused silica, and sapphire.

3. The system as claimed in claim 1, wherein said prismatic body portions of said radiation concentrators are formed on a common body portion of said optical structure.

4. The system as claimed in claim 1, wherein the radiation concentrators are separated by grooves which are substantially V-shaped.

5. The system as claimed in claim 1, wherein each of said concentrators are configured as a multi-lateral truncated pyramid.

6. The system as claimed in claim 1, wherein said body further comprises an anti-reflective coating on at least portions of its surfaces.

7. The system as claimed in claim 1, further comprising a selective light radiation transmission coating on at least portions of its surfaces.

8. The system as claimed in claim 1, wherein said sun-tracking device comprises at least one concave surface.

9. The system as claimed in claim 1, wherein said sun-tracking device comprises a plurality of mirrors.

10. The system as claimed in claim 1, further comprising a light guide coupled to said optical structure for producing homogenous distribution of light directed towards said second surface.

11. The system as claimed in claims 1, further comprising a light guide having a converting internal cross-section at least indirectly coupled to said optical structure for producing homogenous distribution of light directed towards said second surface.

12. The system as claimed in claim 3, wherein said prismatic body portions are formed in between traversing grooves extending from said first surface to said common portion and converging toward said common portion.

13. The system as claimed in claim 1, wherein the two-dimensional array comprises a plurality of rows and columns of the concentrators.

14. The system as claimed in claim 10, wherein the light guide is between the at least one optical structure and the sun-tracking device.

15. The system as claimed in claim 11, wherein the light guide is between the at least one optical structure and the sun-tracking device.

16. A high radiation concentration photovoltaic cell system, comprising:

a solar radiation concentration optical device capable of concentrating solar radiation in two dimensions;

at least one optical structure having a body made of a material at least partially transparent to light and having a first surface capable of receiving thereon photovoltaic cells, and an opposite second surface to be, at least indirectly, exposed to light from said solar radiation concentration device;

the body of said optical structure having a two-dimensional array of contiguous light radiation concentrators which are prismatic associated with said first surface and formed on a common body portion associated with said second surface;

each radiation concentrator having a length defined between said common body portion and said first surface, and tapering toward said first surface in two dimensions all along said length;

each radiation concentrator defining at said first surface a photovoltaic cell-attaching area structured to attach thereto a single photovoltaic cell.

17. The system as claimed in claim 16, wherein each said radiation concentrator is spaced from neighboring radiation concentrators along an entire length and circumference thereof.

18. The system as claimed in claim 16, wherein said radiation concentrators are formed between mutually perpendicular grooves extending between said first surface and said common body portion and converging toward said common body portion.

19. The system as claimed in claim 16, further comprising an optical element capable of providing homogeneous distribution of radiation concentrated by said radiation concentration optical device, to be impinged on said second surface.

20. The system as claimed in claim 16, wherein said material is one of glass, glass ceramic, quartz fused silica, and sapphire.

21. The system as claimed in claim 16, wherein each of said radiation concentrators are configured as a multi-lateral truncated pyramid.

22. The system as claimed in claim 16, wherein said body further comprises anti-reflective coating on at least portions of its surfaces.

23. The system as claimed in claim 16, further comprising a selective light radiation transmission coating on at least portions of its surfaces.

24. The system as claimed in claim 16, wherein said solar radiation concentration optical device comprises at least one concave surface.

25. The system as claimed in claim 16, wherein said solar radiation concentration optical device comprises a plurality of mirrors.

26. The system as claimed in claim 16, wherein the two-dimensional array comprises a plurality of rows and columns of the radiation concentrators.

27. A photovoltaic optical structure, comprising:

a body made of a material at least partially transparent to light and having a first surface capable of receiving thereon photovoltaic cells, and an opposite second surface to be, at least indirectly, exposed to solar radiation;

the body of said optical structure having a two-dimensional array of contiguous light radiation concentrators which are prismatic associated with said first surface and formed on a common body portion associated with said second surface;

each radiation concentrator having a length defined between said common body portion and said first surface, and tapering toward said first surface in two dimensions all along said length;

each radiation concentrator defining at said first surface a photovoltaic cell-attaching area structured to attach thereto a single photovoltaic cell.

28. The optical structure according to claim 27, wherein each said radiation concentrator is spaced from neighboring radiation concentrators along the entire length and circumference thereof.

29. The optical structure as claimed in claim 27, wherein said radiation concentrators are formed between mutually perpendicular grooves extending between said first surface and said common body portion and converging toward said common body portion.

30. The optical structure as claimed in claim 27, wherein said material is one of glass, glass ceramic, quartz fused silica, and sapphire.

31. The optical structure as claimed in claim 27, wherein each of said radiation concentrators are configured as a multi-lateral truncated pyramid.

32. The optical structure as claimed in claim 27, wherein said body further comprises anti-reflective coating on at least portions of its surfaces.

33. The optical structure as claimed in claim 27, further comprising a selective light radiation transmission coating on at least portions of its surfaces.

34. The optical structure as claimed in claim 27, further comprising a light guide coupled to said optical structure for producing homogenous distribution of light directed toward said second surface.

35. The optical structure as claimed in claim 34, further comprising a sun-tracking device, and wherein the light guide is between the optical structure and the sun-tracking device.

36. The optical structure as claimed in claim 27, further comprising a light guide having a converging internal cross-section at least indirectly coupled to said optical structure for producing homogenous distribution of light directed toward said second surface.

37. The optical structure as claimed in claim 36, further comprising a sun-tracking device, and wherein the light guide is between the optical structure and the sun-tracking device.

38. The optical structure as claimed in claim 27, wherein the two-dimensional array comprises a plurality of rows and columns of radiation concentrators.

* * * * *